United States Patent
Kamiyama et al.

(10) Patent No.: US 6,967,359 B2
(45) Date of Patent: Nov. 22, 2005

(54) NITRIDE SEMICONDUCTOR SUBSTRATE PRODUCTION METHOD THEREOF AND SEMICONDUCTOR OPTICAL DEVICE USING THE SAME

(75) Inventors: Satoshi Kamiyama, Aichi (JP); Hiroshi Amano, Aichi (JP)

(73) Assignee: Japan Science and Technology Agency, Kawaguchi (JP)

( * ) Notice: Subject to any disclaimer, the term of this patent is extended or adjusted under 35 U.S.C. 154(b) by 0 days.

(21) Appl. No.: 10/488,753

(22) PCT Filed: Sep. 9, 2002

(86) PCT No.: PCT/JP02/09175
§ 371 (c)(1),
(2), (4) Date: Oct. 14, 2004

(87) PCT Pub. No.: WO03/025263
PCT Pub. Date: Mar. 27, 2003

(65) Prior Publication Data
US 2005/0037526 A1  Feb. 17, 2005

(30) Foreign Application Priority Data
Sep. 13, 2001  (JP) ........................... 2001-278933

(51) Int. Cl.$^7$ ........................................... H01L 31/0328
(52) U.S. Cl. ..................... 257/190; 257/103; 257/627
(58) Field of Search .................... 257/89, 183, 190, 257/103, 627

(56) References Cited

U.S. PATENT DOCUMENTS 6,555,845 B2 *  4/2003  Sunakawa et al.
6,828,591 B2 * 12/2004  Okuyama et al.

FOREIGN PATENT DOCUMENTS

EP   0 810 621 A1   12/1997
EP   1 005 068 A2   5/2000
JP   2001-44497     2/2001
JP   2001-93836     4/2001

OTHER PUBLICATIONS

Shugo Nitta et al., Mass Transport and the reduction of threading dislocation in GaN. Applied Surface Science 2000, vol. 159–160, pp. 421–426.

Hiroshi Amano et al., Effect of Low–temperature Deposited Layer on the Growth of Group–III Nitride on Sapphire, 2000, vol. 21, No. 3, pp. 126–133.

Toshio Nishida et al., Efficient and high–power AlGaN-based ultraviolet light–emitting diode grown on bulk GaN, Applied Science Letters, American Institute of Physics, Aug. 6, 2001, vol. 79, No. 6, pp. 711–712.

Muhammad Asif Khan et al., Stripe Geometry Ultraviolet Light Emitting Diodes at 305 Nanometers Using Quaternary Al InGaN Multiple Quantum Well, The Japan Society of Applied Physics, Jpn. J. Appl. Phys., Dec. 1, 2001, vol. 40, Part 2, No. 12A, pp. L1308–L1310.

* cited by examiner

*Primary Examiner*—Nathan J. Flynn
*Assistant Examiner*—Kevin Quinto
(74) *Attorney, Agent, or Firm*—Westerman, Hattori, Daniels & Adrian, LLP

(57) ABSTRACT

Disclosed are a nitride semiconductor substrate and a production method thereof. Seed crystals made of GaN or AlGaN with a relatively low AlN molar fraction is selectively grown on a first group-III nitride semiconductor, such as GaN, to have a specific crystal face. Then, on the seed crystals, an AlGaN with a high AlN molar fraction is grown through a second group-III nitride semiconductor, such as AlN deposited at a low temperature. The present invention can provide an AlGaN-crystal substrate having a low dislocation density in a wide area without any crack, and a high-performance short-wavelength optical device using the substrate.

13 Claims, 7 Drawing Sheets

NITRIDE SEMICONDUCTOR SUBSTRATE PRODUCTION METHOD THEREOF AND SEMICONDUCTOR OPTICAL DEVICE USING THE SAME

TECHNICAL FIELD

The present invention relates to the structure and production method of a group-III nitride semiconductor substrate which is expected to be applied, particularly, in the field of optical information processing. The present invention also relates to an optical semiconductor device formed using such a substrate.

BACKGROUND ART

Heretofore, there has been known light-emitting and light-receiving devices with a multilayered structure having a base layer made of group-III nitride semiconductor based on GaN or AlGaN with a relatively low molar fraction of AlN (see, for example, the after-mentioned Patent Publication 1 or Non-Patent Publication 1). FIG. 8 shows the structure of crystal layers in a typical conventional GaN-based light-emitting diode. This light-emitting diode includes n-GaN layer 103, an n-GaN first cladding layer 104, a GaInN/GaN multi-quantum-well active layer 105, a p-AlGaN cap layer 106, a p-GaN second cladding layer 107 and a p-GaN contact layer 108, which are deposited in this order on a sapphire substrate 101 through a low-temperature buffer layer 102 made of GaN or AlN.

For example, the GaInN/GaN multi-quantum-well active layer 105 is formed by sandwiching a GaInN quantum-well layer with 3 nm thickness between GaN barrier layers each with 10 nm thickness. After crystal growth, an ohmic semitransparent electrode 109 and a bonding pad electrode 110 each formed of a metal thin film are formed on the surface of the p-GaN contact layer 108, and an n-type electrode 111 is formed on a portion of the surface of the n-GaN first cladding layer 104 which is exposed outside through an etch process. The molar fraction of AlN in the GaInN quantum-well layer can be selectively changed to produce various light-emitting diodes having a wavelength in the range of about 380 to 620 nm.

While a semiconductor laser can be produced in a similar structure, a wavelength range capable of generating laser oscillation at room temperature is narrower than that in the light-emitting diodes.

It is known that the nitride-semiconductor crystal layers produced in the above manner include threading dislocations at a density of $10^8$ $cm^{-2}$ or more, which act as non-radiative centers. Thus, the high threading dislocation density causes deterioration in the external quantum efficiency of the light-emitting diode, and increase in the threshold current or deterioration in the element lifetime of the semiconductor laser. It is also known that threading dislocations in a photodetector, such as photodiodes, cause increase in dark current. Thus, in photodetectors, it is also regarded as one essential challenge to achieve a reduced threading dislocation density.

In late years, an epitaxial lateral overgrowth (ELO) method has been increasingly used as one technique for obtaining a reduced threading dislocation density. FIG. 9 shows the structure of a low-dislocation GaN substrate produced using the ELO method. In FIG. 9, a GaN layer 203 is grown on a sapphire substrate 201 through a low-temperature buffer layer 202 made of GaN or AlN. Equally-spaced stripe masks 204 made, for example, of $SiO_2$ is formed on the surface of the GaN layer 203, and then a GaN overgrowth layer 205 is grown on the surfaces of the GaN layer 203 and the stripe masks 204. The crystal growth of the GaN overgrowth layer 205 is initiated only in portions of the surface of the GaN layer 203 which are not covered by the stripe masks 204, or in exposed portions of the surface of the GaN layer 203, and then crystals grow in the lateral direction to cover over the surfaces of the stripe masks 204 in a while. Finally, the GaN overgrowth layer 205 is formed as a film having a flat surface as shown in FIG. 9.

In the above crystal growth process of the GaN overgrowth layer 205, dislocations 206 to be essentially threaded perpendicular to the crystal growth direction almost never exist above the stripe masks 204 except for crystal junction areas 207. Thus, in the GaN overgrowth layer 205, areas having an extremely low threading dislocation density of about $10^5$ to $10^7$ $cm^{-2}$ are formed above the stripe masks 204 except for the areas between the adjacent the stripe masks 204. This substrate can be used to produce a light-emitting diode or semiconductor laser reduced in non-radiative recombination centers to provide high efficiency and excellent characteristics. A photodetector produced by forming photodetector elements on the low dislocation area of the substrate can have low dark current reduced by several digits.

Lately, an AlGaN-based ultraviolet light-emitting diode grown on a bulk GaN substrate has been reported (see the after-mentioned Non-Patent Publication 2). A 305 nm ultraviolet light-emitting diode using AlInGaN multi-quantum-wells has also been reported (see the after-mentioned Non-Patent Publication 3).

[Patent Publication 1]

Japanese Patent Laid-Open Publication No. 2001-44497

[Non-Patent Publication 1]

Hiroshi Amano, et al., "Low-temperature Deposited Layer in Group-III Nitride Semiconductor Growth on Sapphire Substrate", Journal of Surface Science Society of Japan, 2000, Vol. 21, No. 3, pp 126–133

[Non-Patent Publication 2]

Toshio Nishida, et al., "Efficient and high-power AlGaN-based ultraviolet light-emitting diode grown on bulk GaN", APPLIED PHYSICS LETTERS, American Institute of Physics, 6 AUG. 2001, Vol. 79, No. 6, pp 711–712 [Non-Patent Publication 2]

Muhammad Asif KHAN, et al., "Stripe Geometry Ultraviolet Light-Emitting Diodes at 305 Nanometers Using Quaternary AlInGaN Multiple Quantum Wells", The Japan Society of Applied Physics, Jpn, J. Appl. Phys., 1 Dec. 2001, Vol. 40, Part 2, No. 12A, pp. L1308–L1310

DISCLOSURE OF INVENTION

Methods using the conventional dislocation-reducing technique have difficulties in applications to light-emitting devices to be operated in a short wavelength range of 370 nm or less. Because, in order to obtain such short-wavelength light-emitting devices, such methods are requited to use an AlGaN cladding layer having a high AlN molar fraction so as to assure a bandgap difference for confining carriers in an active layer. In case of semiconductor lasers, it is essentially required to use an AlGaN cladding layer having a higher AlN molar fraction and a larger film thickness in view of an additional requirement on the light confinement necessary for laser emission.

However, in the process of growing such an AlGaN cladding layer having a high AlN molar fraction on a GaN layer, a crack occurs in the AlGaN cladding layer. Specifically, a tensile stress is generated in the AlGaN cladding layer due to the lattice mismatching with the GaN layer, and when the AlGaN cladding layer is grown to have a film thickness greater than a critical value, the crack is formed therein to release the stress. For example, while a semiconductor laser having an emission wavelength of 350 nm can be obtained by using an AlGaN cladding layer having an AlN molar fraction of about 20%, the critical film thickness of the AlGaN cladding layer on a GaN layer is about 0.2 μm which involves an issue on device production. Because the cladding layer is required to have a film thickness of at least 0.4 μm in view of the carrier and/or light confinement As to photodetectors, the reduction in the density of threading dislocation causing dark current is essential as described above. There is also the need for providing a photodetector capable of operating in a wavelength range of 300 nm or less, which can be achieved only by using a nitride semiconductor. In this case, it is required to use AlGaN having a higher AlN molar fraction than that in light-emitting devices. Thus, the conventional methods cannot achieve the formation of a high-quality crystal having a low threading dislocation density without any crack.

The present invention is directed to selectively grow a seed crystal made of GaN, or AlGaN having a relatively low AlN molar fraction, on a group-III nitride semiconductor, such as GaN, to have a specific crystal face, and then grow an AlGaN layer having a high AlN molar fraction through a group-III semiconductor, such as AlN deposited at a low temperature, so as to provide an AlGaN-crystal substrate having a low dislocation area in a wide range without any crack, and a high-performance optical device.

Specifically, according to a first aspect of the present invention, there is provided a nitride semiconductor substrate for a device emitting a short wavelength light of 370 nm or less comprising a single-crystal substrate, a first semiconductor layer made of (0001) face $Al_xGa_{1-x-y}In_y$ ($0 \leq x \leq 0.1$, $0 \leq y \leq 0.5$), a plurality of seed crystals each made of $Al_xGa_{1-x-y}In_yN$ ($0 \leq x \leq 0.1$, $0 \leq y \leq 0.5$) and formed on the semiconductor layer to have a slant surface while being arranged in an equally-spaced stripe pattern, an intermediate layer made of $Al_aGa_{1-a-b}In_bN$ ($0.1 \leq a \leq 1$, $0 \leq b \leq 1$) and deposited on the whole surface of the seed crystals at low temperature of 300 to 800° C., and a second semiconductor layer made of $Al_aGa_{1-a-b}In_bN$ ($0.1 \leq a \leq 1$, $0 \leq b \leq 1$) and formed on the intermediate layer to have a flat surface.

According to a second aspect of the present invention, there is provided a method of producing a nitride semiconductor substrate comprising the steps of (A) performing a selective growth process to form a seed crystal made of $Al_xGa_{1-x-y}In_yN$ ($0 \leq x \leq 0.1$, $0 \leq y \leq 0.5$) on a first semiconductor layer made of (0001) face $Al_xGa_{1-x-y}In_yN$ ($0 \leq x \leq 0.1$, $0 \leq y \leq 0.5$), in such a manner that the seed crystals are provided, respectively, with slant surfaces, and arranged in an equally-spaced stripe pattern, (B) depositing an intermediate layer made of $Al_aGa_{1-a-b}In_bN$ ($0.1 \leq a \leq 1$, $0 \leq b \leq 1$), on the seed crystals at low temperature of 300 to 800° C., and (C) growing a second semiconductor layer made of $Al_aGa_{1-a-b}In_bN$ ($0.1 \leq a \leq 1$, $0 \leq b \leq 1$), on the intermediate layer until the second semiconductor layer has a flat surface.

According to a third aspect of the present invention, there is provided a nitride semiconductor substrate comprising a single-crystal substrate having equally-spaced stripe-shaped grooves, a plurality of seed crystals each made of $Al_xGa_{1-x-y}In_yN$ ($0 \leq x \leq 0.1$, $0 \leq y \leq 0.5$) and formed on the convex portions of the single-crystal substrate to have a slant surface portion, an intermediate layer made of $Al_aGa_{1-a-b}In_bN$ ($0.1 \leq a \leq 1$, $0 \leq b \leq 1$) and deposited on the seed crystals at low temperature of 300 to 800° C., and a second semiconductor layer made of $Al_aGa_{1-a-b}In_bN$ ($0.1 \leq a \leq 1$, $0 \leq b \leq 1$) and formed on the intermediate layer to have a flat surface.

According to a fourth aspect of the present invention, there is provided a method of producing a nitride semiconductor substrate comprising the steps of (A) forming a plurality of seed crystals each made of $Al_xGa_{1-x-y}In_yN$ ($0 \leq x \leq 0.1$, $0 \leq y \leq 0.5$), on a single-crystal substrate having equally-spaced stripe-shaped grooves, in an equally-spaced stripe pattern, (B) depositing an intermediate layer made of $Al_aGa_{1-a-b}In_bN$ ($0.1 \leq a \leq 1$, $0 \leq b \leq 1$), on the seed crystals at low temperature of 300 to 800° C., and (C) growing a semiconductor layer made of $Al_aGa_{1-a-b}In_bN$ ($0.1 \leq a \leq 1$, $0 \leq b \leq 1$), on the intermediate layer until the semiconductor layer has a flat surface.

According to a fifth aspect of the present invention, there is provided a semiconductor light-emitting device comprising the nitride semiconductor substrate set forth in the first or third aspect of the present invention, a first conductive-type cladding layer made of $Al_xGa_{1-x-y}In_yN$ ($0.1 \leq x \leq 1$, $0 \leq y \leq 0.5$), a second conductive-type cladding layer made of $Al_xGa_{1-x-y}In_yN$ ($0.1 \leq x \leq 1$, $0 \leq y \leq 0.5$), and an active layer made of $Al_xGa_{1-x-y}In_yN$ ($0 \leq x \leq 1$, $0 \leq y \leq 1$) and having a bandgap less than that of the cladding layers.

The above semiconductor light-emitting device may have an emission wavelength of 370 nm or less, and an external quantum efficiency (ηext) of 0.1% or more, wherein the external quantum efficiency (ηext)=Po/(I×V), wherein Po is a light output, I being an operating current of the device, and V being an operating voltage of the device.

According to a sixth aspect of the present invention, there is provided a photodetector comprising the nitride semiconductor substrate set forth in the first or third aspect of the present invention, a first conductive-type semiconductor layer made of $Al_xGa_{1-x-y}In_yN$ ($0.1 \leq x \leq 1$, $0 \leq y \leq 0.5$), a second conductive-type semiconductor layer made of $Al_xGa_{1-x-y}In_yN$ ($0.1 \leq x \leq 1$, $0 \leq y \leq 0.5$), and a light-absorbing layer made of $Al_xGa_{1-x-y}In_yN$ ($0 \leq x \leq 1$, $0 \leq y \leq 1$).

In the present invention, the single-crystal substrate may be made of one selected from the group consisting of sapphire, silicon carbide, silicon and $ZrB_2$.

The term "slant surface" herein a surface which is not perpendicular or parallel to the surface of the single-crystal substrate, and the slant surface may be the (1-101) face or (11-22) face of the seed crystal made, for example, of GaN. The conditions of growing the seed crystal can be varied to switchably create a surface perpendicular to the surface of the single-crystal substrate or the slant surface.

While the spacing or interval in the equally-spaced stripe pattern may be set at any value to the same effect of obtaining a reduced dislocation density, the lower limit of the interval is determined by the resolution of a photolithography for use in patterning into the equally-spaced stripe pattern, and it is practically difficult to set the interval at 1 μm or less. The upper limit of the interval is dependent on a time required for obtaining a flat surface in the crystal formed on the seed crystals. If the equally-spaced stripe pattern has an interval of 20 μm, the required time will go over 10 hours, which is disadvantageous to actual production. Thus, it is desirable to set the interval in the range of about 1 to 20 μm.

The intermediate layer is deposited at a low temperature of 300 to 800° C. If the temperature is greater than 800° C., the intermediate layer will be formed as a single crystal, and the lattice strain between the seed crystals, such as GaN, and the second semiconductor layer, such as AlGaN, formed on the intermediate layer will cause a crack in the second semiconductor layer etc. If the temperature is less than 800° C., no layer will be deposited due to thermal decomposition of a source gas. The intermediate layer deposited in the range of 300 to 800° C. is an aggregate of fine granular crystals which have a function of relaxing the stress due to the lattice mismatching to prevent the occurrence of crack.

In the present invention, the second semiconductor layer made of $Al_xGa_{1-x-y}In_yN$ ($0.1 \leq a \leq 1$, $0 \leq b \leq 1$) is formed on the intermediate layer to have a flat surface. For example, in an optical device using an extremely thin active layer, so-called quantum well, if the surface of the second semiconductor layer is not flattened or is not flat, the active layer cannot be formed in a uniform film thickness.

BEST MODE FOR CARRYING OUT THE INVENTION

With reference to the drawings, an embodiment of the present invention will now be described.

[First Embodiment]

Figure 1:
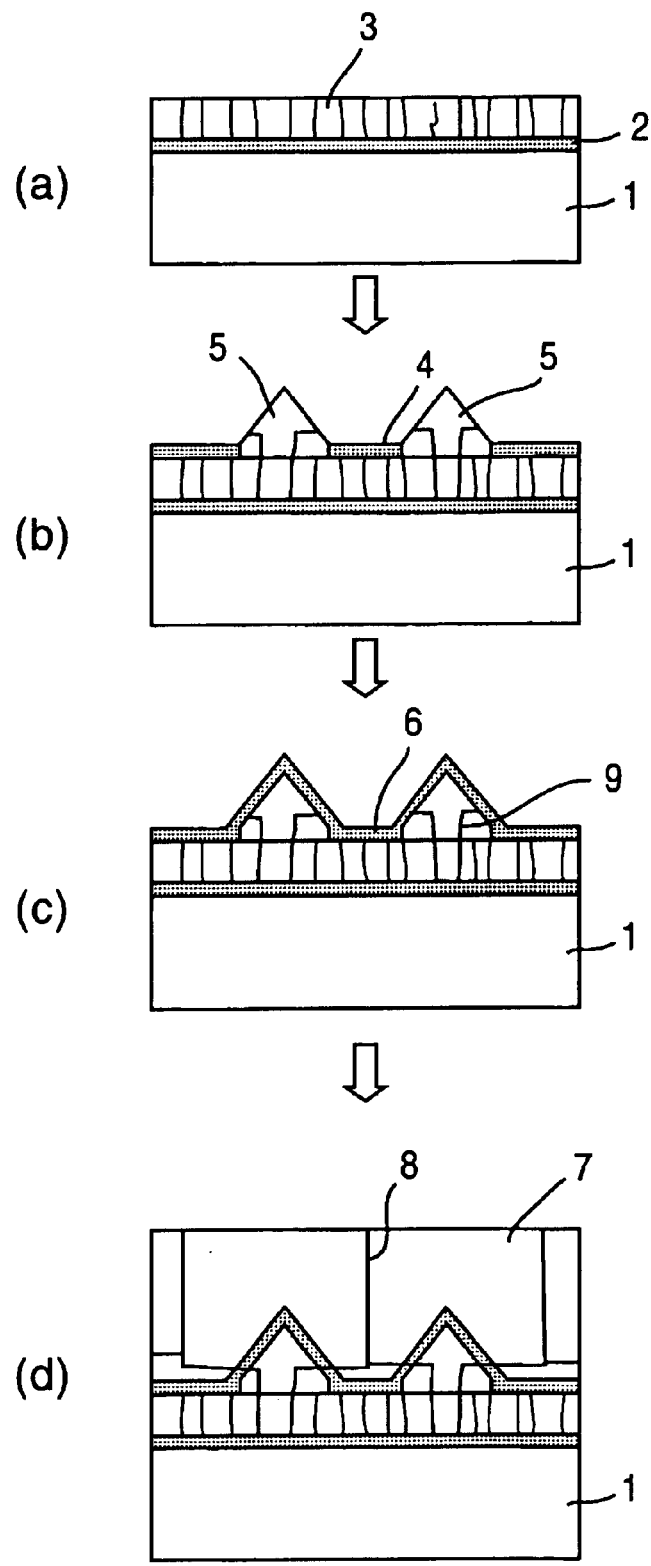
FIGS. 1(a) to 1(d) are schematic diagrams showing the structure and production method of a low-dislocation-density group-III nitride semiconductor substrate according to a first embodiment of the present invention.

FIGS. 1(a) to 1(d) show the structure and production method of a low-dislocation-density group-III nitride semiconductor substrate according to a first embodiment of the present invention. Through an organometallic-compound vapor phase growth, an AlN low-temperature buffer layer 2 and a GaN layer 3 are formed on a (0001) face sapphire substrate 1 in this order, at about 500° C. and about 1000° C., respectively. After the sapphire substrate 1 with the buffer and GaN layers 1, 3 is taken out of a growth apparatus, stripe masks, for example, comprising $SiO_2$ masks 4 each having a width of 5 μm and arranged an interval of 10 μm, are formed along the crystal orientation <11-21>thereof, and then the GaN layer can be selectively regrown at appropriate conditions to form a plurality of GaN seed crystals 5 each having a specific shape as shown in FIG. 1(b). Each of the formed GaN seed crystals has a slant surface corresponding to the (1-101) face.

After the $SiO_2$ masks 4 or stripe masks are removed, the substrate temperature is reduced down, for example, to 500° C., to grow an AlN low-temperature-deposited intermediate layer 6, as shown in FIG 1(c). Then, an $Al_{0.2}Ga_{0.88}N$ layer 7 is grown at about 1000° C., as shown in FIG. 1(d). The $Al_{0.2}Ga_{0.8}N$ layer 7 is flattened along with the growth, and finally has a fully flat surface. In the $Al_{0.2}Ga_{0.8}N$ layer 7 formed in this way, most dislocations 9 are concentrated only around respective crystal junction areas 8 or the respective approximate centers between the adjacent GaN seed crystals 5, and extremely limited dislocations 9 are created in the remaining area. Thus, the above method can achieve a high-quality AlGaN substrate having a low dislocation density over the entire surface without any crack.

Figure 2:
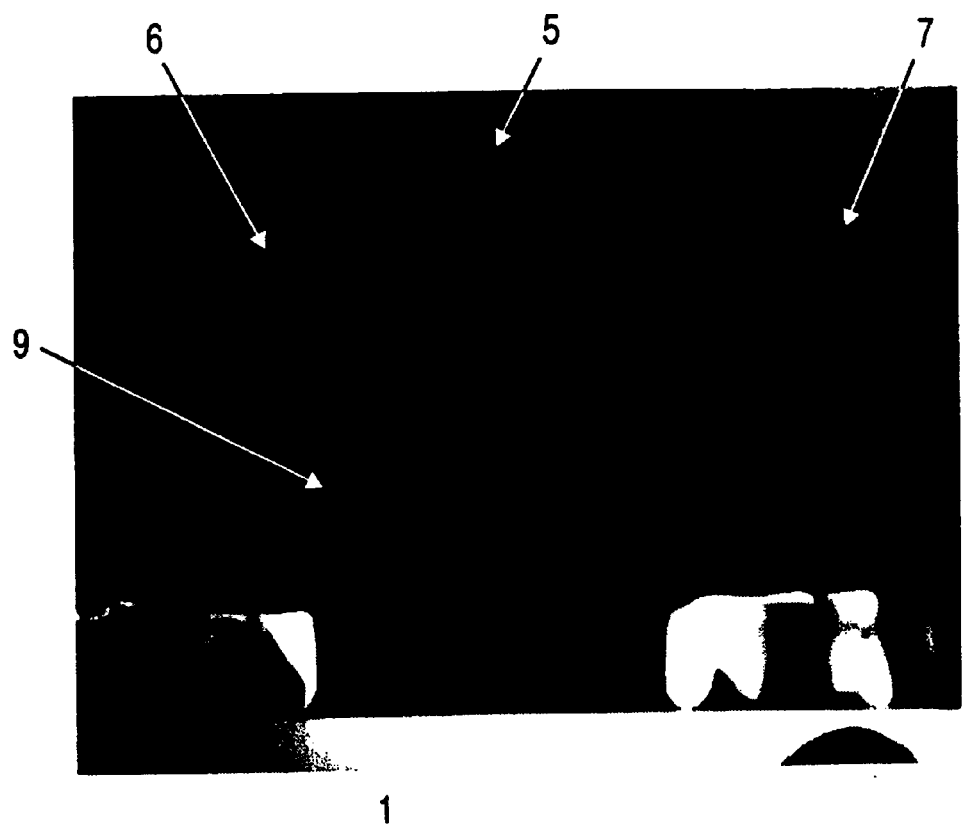
FIG. 2 is a transmission electronic micrograph of the section of the low-dislocation-density group-III nitride semiconductor substrate according to the first embodiment.

FIG. 2 is a transmission electronic micrograph of the section of the AlGaN substrate. Typically, the GaN layer 3 grown on the sapphire substrate 1 has threading dislocations at a density of about $10^9$ cm$^{-2}$. While these dislocations is turned over directly to the GaN seed crystals 5, each of the GaN seed crystals 5 grows while maintaining the (1-101) face, and thereby the dislocations are bent at an approximately right angle, as seen in FIG. 2.

Thus, almost no dislocation is observed in the areas above the GaN seed crystals 5. The dislocations bent and propagated in a direction perpendicular to the growth direction are turned over to the subsequently grown $Al_{0.2}Ga_{0.8}N$ layer 7, and the dislocations will be vanished in the areas where the portions of the $Al_{0.2}Ga_{0.8}N$ layer 7 growing laterally from the adjacent GaN seed crystals 5 are combined or joined together, or will be re-bent in the growth direction in these junction areas to extend toward the surface of the $Al_{0.2}Ga_{0.8}N$ layer 7. Thus, except for the junction areas, the remaining area has an extremely low dislocation density. This low-dislocation area has a dislocation density of $10^7$ cm$^{-2}$. A light-emitting device produced by forming device elements on this low-transition-density substrate can have significantly reduced non-radiative recombination centers to obtain high quantum efficiency. A light-receiving device produced by forming device elements on the low-transition-density substrate can achieve excellent characteristics having high voltage resistance and reduced dark current.

While the dislocation-reducing technique has been described in connection with the $Al_{0.2}Ga_{0.8}N$ layer 7 in the first embodiment, it can also be applied to any AlGaInN having different compositions. Further, the GaN layer 3 and the GaN seed crystals 5 may be substituted with an AlGaN layer or AlGaInN layer. However, if the seed crystals 5 have a high AlN molar fraction, the deposition of polycrystals on the $SiO_2$ masks 4 or stripe masks will be undesirably increased. Thus, the AlN molar fraction in AlGaN is preferably set at 10% or less.

Instead of the AlN low-temperature intermediate layer, AlGaInN formed at the same low temperature may be used. Further, while the first embodiment has been described in connection of the method using the $SiO_2$ masks 4 or stripe masks along the orientation <11-20>to provide the slant surface of the seed crystal 5 corresponding to the (1-101) face, the stripe masks along the orientation <1-100>may be used to provide the slant surface of the seed crystal 5 corresponding to the (11-22) face so as to obtain the same effect. Furthermore, while the first embodiment has employed the (0001) face sapphire substrate, it is understood that any other suitable substrate, such as a sapphire substrate having different orientations, or a single-crystal substrate made of SiC, Si, $ZrB_2$ etc, may be used to obtain the same effect.

[Second Embodiment]

Figure 3:
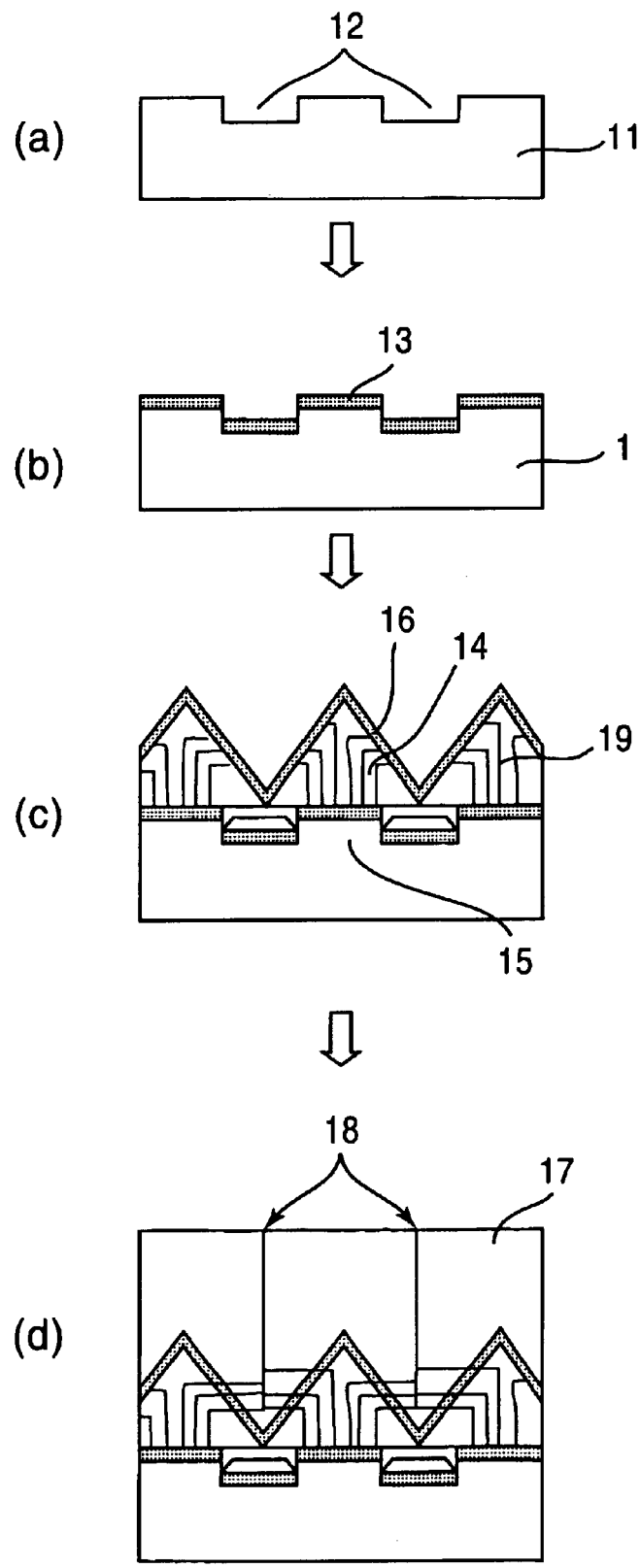
FIGS. 3(a) to 3(d) are schematic diagrams showing the structure and production method of a low-dislocation-density group-III nitride semiconductor substrate according to a second embodiment of the present invention.

FIGS. 3(a) to 3(d) show the structure and production method of a low-dislocation-density group-III nitride semiconductor substrate according to a second embodiment of the present invention. In advance of the crystal growth of nitride semiconductor, equally-spaced grooves having, for example, a width of 5 $\mu$m, an interval 10 $\mu$m and a depth 2 $\mu$m, are formed in the surface of a (0001) face sapphire substrate 11. The orientation of each of the equally-spaced grooves 12 is arranged in parallel to the crystal orientation <1-100>of the sapphire substrate 11. Then, as shown in FIGS. 3(b) and 3(c), an AlN low-temperature buffer layer 13 and GaN seed crystals 14 are formed on the sapphire substrate 11 in this order, respectively, at about 500° C. and about 1000C, through an organometallic-compound vapor phase growth. In this process, the GaN seed crystal can be grown at appropriate conditions to form the (1-101) face in a slant surface of each of the GaN seed crystals 14 on the convex portions 15 of the sapphire substrate.

While crystals are concurrently grown in the respective grooves or convex portions of the sapphire substrate, the seed crystals on the convex portions 15 of the sapphire substrate are connected with each other to block the supply of raw materials therein so as to discontinue the growth in the convex portions. The substrate temperature is then reduced down to about 500° C. to grow an AlN low-temperature-deposited intermediate layer 16. Then, after re-heated up to 1000° C., an $Al_{0.2}Ga_{0.8}N$ layer 17 is grown, as shown in FIG. 3(d). The $Al_{0.2}Ga_{0.8}N$ layer 17 is flattened along with the growth, and finally has a fully flat surface. In the $Al0.2Ga_{0.8}N$ layer 17 formed in this way, most dislocations 19 are concentrated only around respective crystal junction areas 18 or the respective approximate centers between the adjacent GaN seed crystals 14, and extremely limited dislocations 19 are created in the remaining area. Thus, the above method can achieve a high-quality AlGaN substrate having a low dislocation density over the entire surface without any crack.

Figure 4:
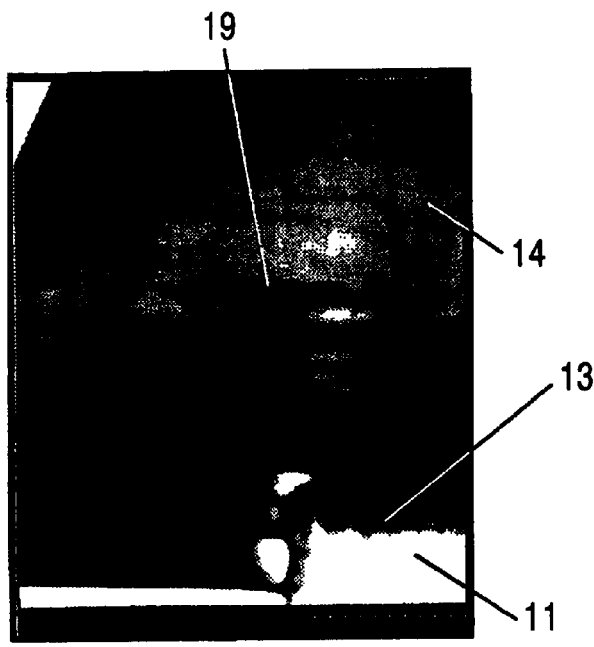
FIG. 4 is a transmission electronic micrograph of the section of the low-dislocation-density group-III nitride semiconductor substrate according to the second embodiment.

FIG. 4 is a transmission electronic micrograph of the section of the AlGaN substrate. Typically, threading dislocations at a density of about $10^9$ cm$^{-2}$ exist below the GaN seed layers 14 grown on the sapphire substrate 11. However, the dislocations 19 are bent at an approximately right angle, as seen in FIG. 4, because each of the GaN seed crystals 14 grow while maintaining the (1-101) face. Thus, almost no dislocation 19 is observed in the areas above the GaN seed crystals 14. The dislocations bent and propagated in a direction perpendicular to the growth direction are turned over to the subsequently grown $Al_{0.2}Ga_{0.8}N$ layer 17, and the dislocations will be vanished in the areas where the portions of the $Al_{0.2}Ga_{0.8}N$ layer 17 growing laterally from the adjacent GaN seed crystals 14 are combined or joined together, or will be re-bent in the growth direction in these junction areas to extend toward the surface of the $Al_{0.2}Ga_{0.8}N$ layer 17.

Thus, except for the junction areas, the remaining area has an extremely low dislocation density. This low-dislocation area has a dislocation density of $10^7$ cm$^{-2}$. A light-emitting device produced by forming device elements on this low-transition-density substrate can have significantly reduced non-radiative recombination centers to obtain high quantum efficiency. A light-receiving device produced by forming device elements on the low-transition-density substrate can achieve excellent characteristics having high voltage resistance and reduced dark current.

While the dislocation-reducing technique has been described in connection with the $Al_{0.2\ Ga0.8}N$ layer 17 in the second embodiment, it can also be applied to any AlGaInN having different compositions. Further, the GaN seed crystals 14 may be substituted with an AlGaInN layer. The low-temperature intermediate layer may also be substituted with AlGaInN. Further, while the first embodiment has been described in connection of the method using the equally-spaced grooves 12 along the orientation <11-20>to provide the slant surface of the seed crystal 14 corresponding to the (1-101) face, the equally-spaced grooves 12 along the orientation <1-100>may be used to provide the slant surface of the seed crystal 14 corresponding to the (11-22) face so as to obtain the same effect. Furthermore, while the second embodiment has employed the (0001) face sapphire substrate, it is understood that any other suitable substrate, such as a sapphire substrate having different orientations, or a single-crystal substrate made of SiC, Si, $ZrB_2$ etc, may be used to obtain the same effect.

[Third Embodiment]

Figure 5:
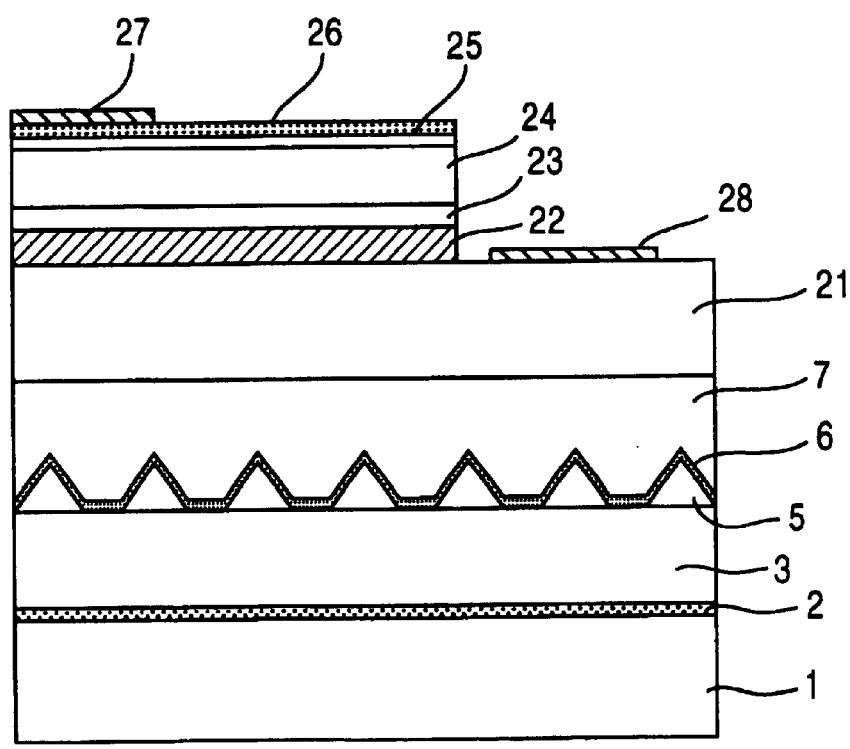
FIG. 5 is a schematic diagram showing the structure of an ultraviolet light-emitting diode according to a third embodiment of the present invention.

FIG. 5 shows the structure of an ultraviolet light-emitting diode according to a third embodiment of the present invention. After forming the low-transition-density nitride semiconductor substrate illustrated in FIG. 1, an n-$Al_{0.2}Ga_{0.8}N$ first cladding layer 21, a multi-quantum-well active layer 22, a p-$Al_{0.4}Ga_{0.6}N$ cap layer 23, a p-$Al_{0.2}Ga_{0.8}N$ second cladding layer 24, and a p-GaN contact layer 25 are successively grown on the nitride semiconductor substrate in this order, through an organometallic-compound vapor phase growth.

For example, the multi-quantum-well active layer 22 comprises a GaN quantum layer having a thickness of 3 nm, and an $Al_{0.1}Ga_{0.8}N$ barrier layer having a thickness of 9 nm. After the completion of the crystal growth, an ohmic semi-transparent electrode 26 and a bonding pad electrode 27 each formed of a metal thin film are formed on the surface of the p-GaN contact layer 25, and an n-type electrode 28 is formed on a portion of the surface of the n-$Al_{0.2}Ga_{0.8}N$ first cladding layer 21 which is exposed outside through an etch process.

In this ultraviolet light-emitting diode, a certain voltage is applied between the bonding pad electrode 27 and the n-type electrode 28 to supply a current, so that electrons and electron holes are injected into the multi-quantum-well active layer 22 to emit a light with a wavelength of about 350 nm corresponding to a bandgap thereof. The layers constituting the light-emitting diode are deposited on the aforementioned $Al_{0.2}Ga_{8.0}N$ layer 7 having a low dislocation density. Thus, the multi-quantum-well active layer 22 also has a low dislocation density. That is, the rate of non-radiative recombination is significantly low, and most electron-hole pairs are recombined in concurrence with light emissions. This can provide extremely high quantum efficiency. While the third embodiment has employed the low-transition-density AlGaN substrate according to the first embodiment, the low-transition-density AlGaN substrate according to the second embodiment may also be used to obtain the same effect.

[Fourth Embodiment]

Figure 6:
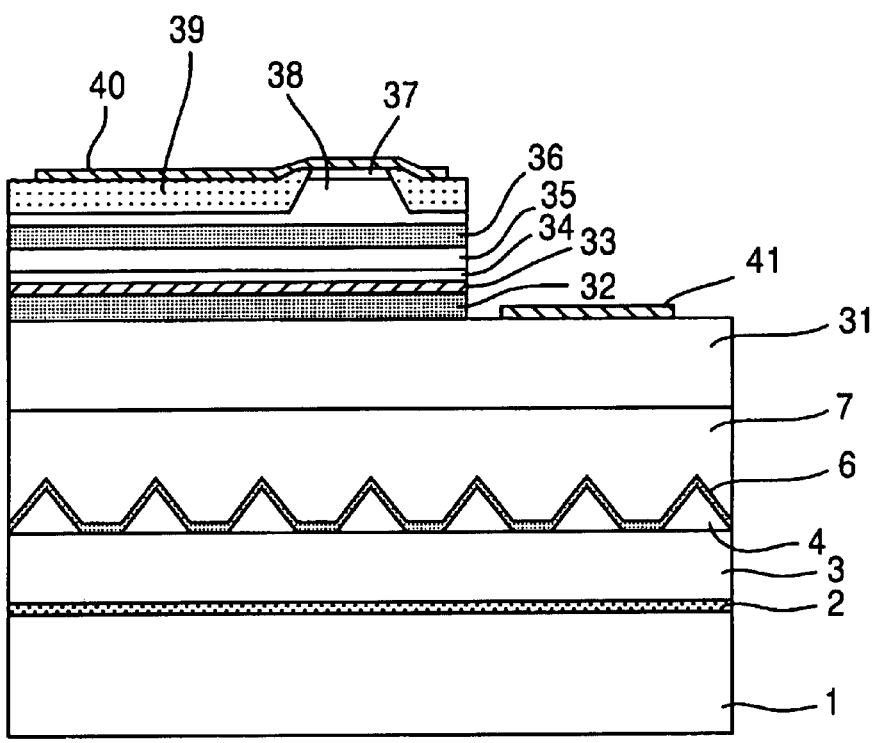
FIG. 6 is a schematic diagram showing the structure of an ultraviolet semiconductor laser according to a fourth embodiment of the present invention.

FIG. 6 shows the structure of an ultraviolet semiconductor laser according to a fourth embodiment of the present invention. After forming the low-transition-density nitride semiconductor substrate illustrated in FIG. 1, an n-$Al_{0.2}Ga_{8.0}N$ first cladding layer 31, an n-$Al_{0.1}Ga_{0.9}N$ first optical guide layer 32, a multi-quantum-well active layer 32, a p-$Al_{0.4}Ga_{0.6}N$ cap layer 34, a p-$Al_{0.1}Ga_{0.9}N$ second optical guide layer 35, a p-$Al_{0.2}Ga_{8.0}N$ second cladding layer 36, and a p-GaN contact layer 37 are successively grown on the nitride semiconductor substrate in this order, through an organometallic-compound vapor phase growth.

For example, the multi-quantum-well active layer 33 comprises a GaN quantum layer having a thickness of 3 nm, and an $Al_{0.1}Ga_{0.9}N$ barrier layer having a thickness of 9 nm. After the completion of the crystal growth, a ridge stripe 38, for example, having a width of 2 mm is formed on the surface of the p-GaN contact layer 37, and a dielectric layer 39 having a low refractive index and made, for example, of $SiO_2$, are formed on either side of the ridge stripe 38.

A p-type electrode 40 is formed on the ridge stripe 38 and the dielectric layers 39. An n-type electrode 41 is also formed on a portion of the surface of the n-$Al_{0.2}Ga_{0.8}N$ first cladding layer 31 which is exposed outside through an etch process. Further, through an incision or etch process, resonant mirrors are formed on the both sides of the device, respectively.

In this ultraviolet semiconductor laser, a certain voltage is applied between the p-type electrode 40 and the n-type electrode 41 to supply a current, so that electrons and electron holes are injected into the multi-quantum-well active layer 33 to emit a light with a wavelength of about 350 nm corresponding to a bandgap thereof and a laser beam through an optical amplification action. The layers constituting the semiconductor laser are deposited on the aforementioned $Al_{0.2}Ga_{0.8}N$ layer 7 having a low dislocation density. Thus, the multi-quantum-well active layer 33 also has a low dislocation density.

That is, the rate of non-radiative recombination is significantly low, and most electron-hole pairs are recombined in concurrence with light emissions. This can provide a high optical gain to achieve a laser oscillation with high differential efficiency and low threshold current density. While the fourth embodiment has employed the low-transition-density AlGaN substrate according to the first embodiment, the low-transition-density AlGaN substrate according to the second embodiment may also be used to obtain the same effect.

[Fifth Embodiment]

Figure 7:
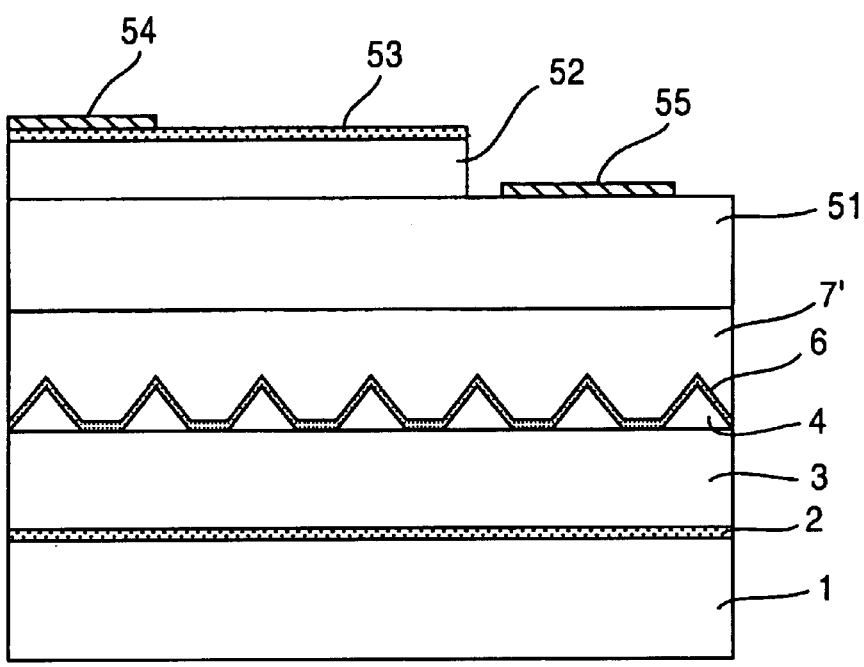
FIG. 7 is a schematic diagram showing the structure of an ultraviolet light-emitting diode according to a fifth embodiment of the present invention.
Figure 8:
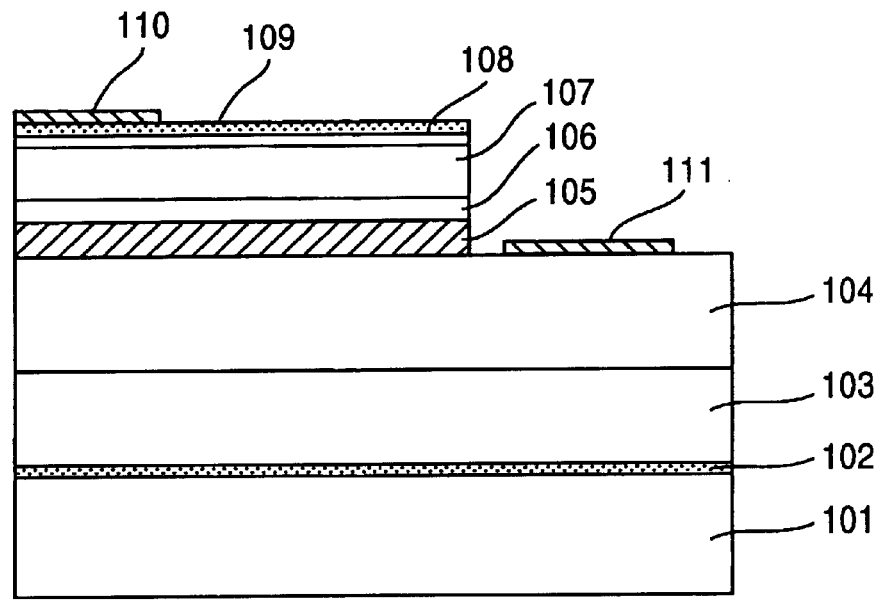
FIG. 8 is a schematic diagram showing the structure of crystal layers of a conventional GaN-bases light-emitting diode.
Figure 9:
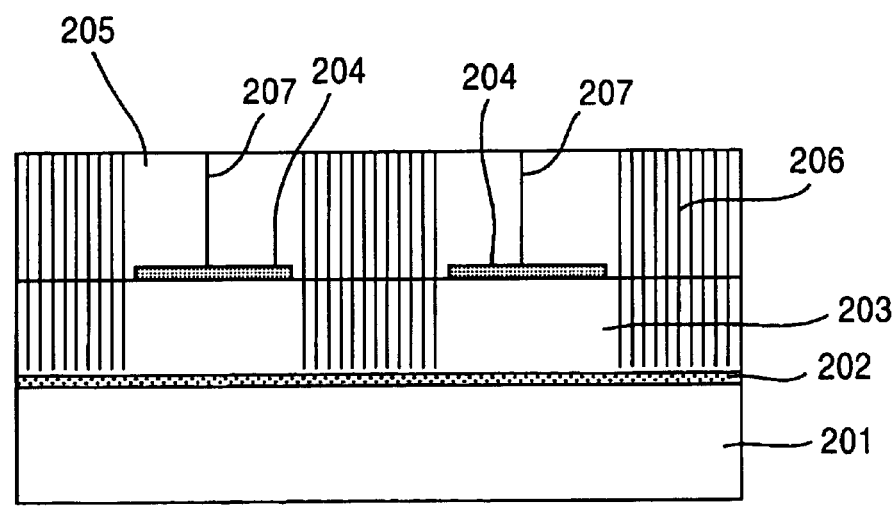
FIG. 9 is a schematic diagram showing the structure of a low-dislocation-density GaN substrate obtained through a conventional epitaxial lateral overgrowth (ELO) method.

FIG. 7 shows the structure of an ultraviolet photodetector according to a fifth embodiment of the present invention. While this structure is similar to the low-dislocation-density nitride semiconductor substrate illustrated in FIG. 1, the top layer is changed from the $Al_{0.2}Ga_{0.8}N$ layer 7 to an $Al_{0.4}Ga_{0.6}N$ layer 7'. On this substrate, an n-$Al_{0.4}Ga_{0.6}N$ layer 51 and an $n^-$-$Al_{0.4}Ga_{0.6}N$ light-absorbing layer 52 are successively grown in this order, through an organometallic-compound vapor phase growth. After the completion of the crystal growth, a Schottky semitransparent electrode 53 and a bonding pad electrode 54 each formed of a metal thin film are formed on the surface of the $n^-$-$Al_{0.4}Ga_{0.6}N$ light-absorbing layer 52, and an n-type electrode 55 is formed on a portion of the surface of the n-$Al_{0.4}Ga_{0.6}N$ layer 51 which is exposed outside through an etch process.

In this ultraviolet photodetector, a certain reverse bias voltage is applied between the bonding pad electrode 54 and the n-type electrode 55, to allow a light having a wavelength of 300 nm or less to be incident through the Schottky semitransparent electrode 53. Thus, the light is absorbed by the $n^-$-$Al_{0.4}Ga_{0.6}N$ light-absorbing layer 52 below the Schottky semitransparent electrode 53 to create electron-hole pairs. An electric field generated by the bias voltage acts to accelerate these electron-hole pairs. Then, the electrons and the holes are moved, respectively, to the n-type electrode 55 and the bonding pad electrode 54, and then extracted out of the device as a photoelectric current.

The layers constituting the ultraviolet photodetector are deposited on the aforementioned $Al_{0.4}Ga_{6.0}N$ layer 7' having a low dislocation density. Thus, $n^-$-$Al_{0.4}Ga_{6.0}N$ light-absorbing layer 52 also has a low dislocation density. This can provide high quantum efficiency and significantly reduced dark current to achieve excellent device characteristic. Particularly, the dark-current reduction effect is significant. Specifically, the dark current for a reverse bias voltage of 10V was 10 pA/cm2 or less. This value is substantially reduced by about eight digits as compared to the dark current in a conventional device produced by forming device elements on a crystal having a high dislocation density.

While the fifth embodiment has employed the low-transition-density AlGaN substrate according to the first embodiment, the low-transition-density AlGaN substrate according to the second embodiment may also be used to obtain the same effect. Further, while the fifth embodiment has shown a Schottky-type photodiode as a photodetector, the present invention can be applied to different types of photodetector, such as a pin-type photodiode or a phototransistor. Further, the present invention can be applied to an image sensor, for example, integrated in 2-dimensional array.

EXAMPLE

Based on the structure of the device according to the third embodiment, an ultraviolet light-emitting diode was produced. On the low-dislocation-density nitride semiconductor substrate illustrated in FIG. 1, an n-$Al_{0.2}Ga_{0.8}N$ first cladding layer 21, a multi-quantum-well active layer 22, a p-$Al_{0.4}Ga_{0.6}N$ cap layer 23, a p-$Al_{0.2}Ga_{0.8}N$ second cladding layer 24, and a p-GaN contact layer 25 were successively grown in this order, through an organometallic-compound vapor phase growth. The multi-quantum-well active layer 22 was composed of a GaN quantum layer and an $Al_{0.1}Ga_{0.9}N$ barrier layer, and the thickness of the GaN quantum layer was adjusted to be varied in the range of 2 nm to 4 nm to change the emission wavelength in the range of 320 nm to 360 nm. After the completion of the crystal growth, an ohmic semitransparent electrode 26 and a bonding pad electrode 27 each formed of a metal thin film were formed on the surface of the p-GaN contact layer 25, and an n-type electrode 28 was formed on a portion of the surface of the n-$Al_{0.2}Ga_{0.8}N$ first cladding layer 21 which was exposed outside through an etch process.

Figure 10:
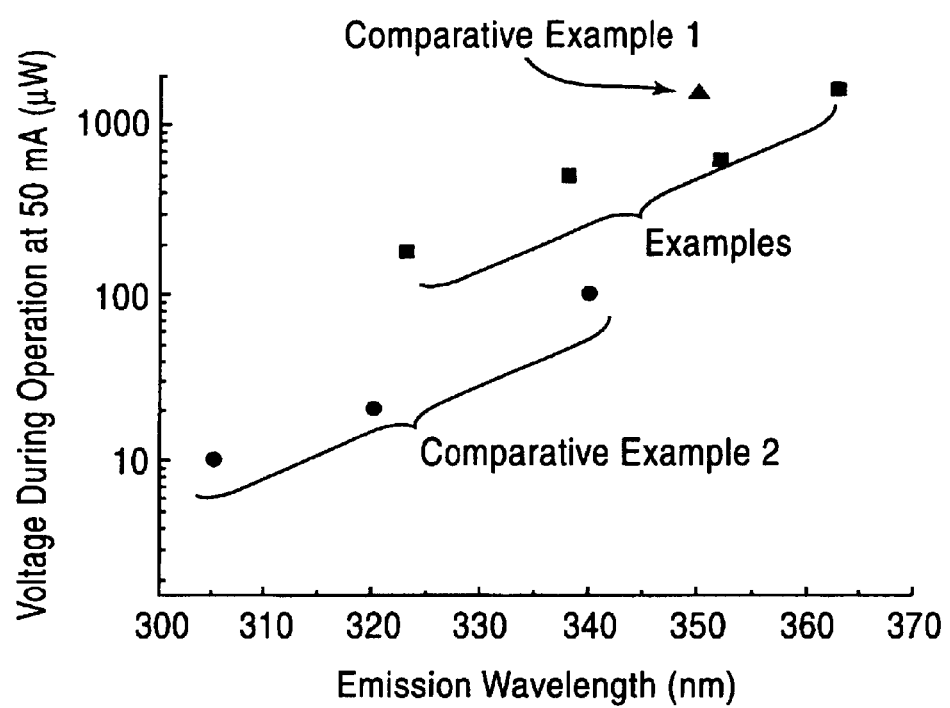
FIG. 10 is a graph showing optical output characteristics obtained from an inventive example and conventional examples.

FIG. 10 shows optical-output characteristics of the obtained ultraviolet light-emitting diode. The comparison of emission wavelength and voltage during an operation at 50 mA was as follows: 323 nm→7.4V, 338 nm→7.1 V, 352 nm→5.0 V, and 363 nm→4.7 V. FIG. 10 also shows the test results reported in the aforementioned Non-Patent Publications 1 and 3 as comparative examples 1 and 2, respectively. As seen in FIG. 10, the inventive example exhibits an external quantum efficiency of 0.1% or more in the emission wavelength range of 370 nm or less, which is higher than that of the comparative examples, at any emission wavelength.

INDUSTRIAL APPLICABILITY

The present invention can be used to produce a group-III nitride semiconductor substrate having a low dislocation density in the entire surface. Thus, the present invention can achieve high-performance short-wavelength light-emitting and light-receiving devices.

What is claimed is:

1. A nitride semiconductor substrate for a device emitting a short wavelength light of 370 nm or less comprising:
   a single-crystal substrate;
   a first semiconductor layer made of (0001) face $Al_xGa_{1-x-y}In_yN$ ($0 \leq x \leq 0.1$, $0 \leq y \leq 0.5$);
   a plurality of seed crystals each made of $Al_xGa_{1-x-y}In_yN$ ($0 \leq x \leq 0.1$, $0 \leq y \leq 0.5$) and formed on said semiconductor layer to have a slant surface while being arranged in an equally-spaced stripe pattern;
   an intermediate layer made of $Al_aGa_{1-a-b}In_bN$ ($0.1 \leq a \leq 1$, $0 \leq b \leq 1$), and deposited on a whole surface of said seed crystals at low temperature of 300 to 800° C.; and
   a second semiconductor layer made of $Al_aGa_{1-a-b}In_bN$ ($0.1 \leq a \leq 1$, $0 \leq b \leq 1$), and formed on said intermediate layer to have a flat surface.

2. The nitride semiconductor substrate as defined in claim 1, wherein said slant surface is (1-101) face or (11-22) face.

3. The nitride semiconductor substrate as defined in claim 1, wherein said $Al_xGa_{1-x-y}In_yN$ is GaN.

4. The nitride semiconductor substrate as defined in claim 1, wherein said single-crystal substrate is made of one selected from the group consisting of sapphire, silicon carbide, silicon and $ZrB_2$.

5. A method of producing a nitride semiconductor substrate comprising the steps of:
   performing a selective growth process to form a plurality of seed crystals made of $Al_xGa_{1-x-y}In_yN$ ($0 \leq x \leq 0.1$, $0 \leq y \leq 0.5$) on a first semiconductor layer made of (0001) face $Al_xGa_{1-x-y}In_yN$ ($0 \leq x \leq 0.1$, $0 \leq y \leq 0.5$), in such a manner said seed crystals are provide, respectively, with slant surfaces, and arranged in an equally-spaced stripe pattern;
   depositing an intermediate layer made of $Al_aGa_{1-a-b}In_bN$ ($0.1 \leq a \leq 1$, $0 \leq b \leq 1$), on said seed crystals at low temperature of 300 to 800° C.; and
   growing a second semiconductor layer made of $Al_aGa_{1-a-b}In_bN$ ($0.1 \leq a \leq 1$, $0 \leq b \leq 1$), on said intermediate layer until said second semiconductor layer has a flat surface.

6. A nitride semiconductor substrate comprising:
   a single-crystal substrate having equally-spaced stripe-shaped grooves;
   a plurality of seed crystals each made of $Al_xGa_{1-x-y}In_yN$ ($0 \leq x \leq 0.1$, $0 \leq y \leq 0.5$) and formed on the convex portions of said single-crystal substrate to have a slant surface;
   an intermediate layer made of $Al_aGa_{1-a-b}In_bN$ ($0.1 \leq a \leq 1$, $0 \leq b \leq 1$), and deposited on said seed crystals at low temperature of 300 to 800° C.; and
   a second semiconductor layer made of $Al_aGa_{1-a-b}In_bN$ ($0.1 \leq a \leq 1$, $0 \leq b \leq 1$), and formed on said intermediate layer to have a flat surface.

7. The nitride semiconductor substrate as defined in claim 6, wherein said slant surface is (1-101) face or (11-22) face.

8. The nitride semiconductor substrate as defined in claim 6, wherein said seed crystals are arranged in an equally-spaced stripe pattern, and made of GaN.

9. The nitride semiconductor substrate as defined in claim 6, wherein said single-crystal substrate is made of one selected from the group consisting of sapphire, silicon carbide, silicon and $ZrB_2$.

10. A method of producing a nitride semiconductor substrate comprising the steps of:
    forming a plurality of seed crystals each made of $Al_xGa_{1-x-y}In_yN$ ($0 \leq x \leq 0.1$, $0 \leq y \leq 0.5$), on a single-crystal substrate having equally-spaced stripe-shaped grooves, in an equally-spaced stripe pattern;
    depositing an intermediate layer made of $Al_aGa_{1-a-b}In_bN$ ($0.1 \leq a \leq 1$, $0 \leq b \leq 0.5$), on said seed crystals at low temperature of 300 to 800° C.; and
    growing a semiconductor layer made of $Al_aGa_{1-a-b}In_bN$ ($0.1 \leq a \leq 1$, $0 \leq b \leq 1$), on said intermediate layer until said semiconductor layer has a flat surface.

11. A semiconductor light-emitting device comprising:
    the nitride semiconductor substrate as defined in claim 1 or 6;
    a first conductive-type cladding layer made of $Al_xGa_{1-x-y}In_yN$ ($0.1 \leq x \leq 1$, $0 \leq y \leq 0.5$);
    a second conductive-type cladding layer made of $Al_xGa_{1-x-y}In_yN$ ($0.1 \leq x \leq 1$, $0 \leq y \leq 0.5$); and
    an active layer made of $Al_xGa_{1-x-y}In_yN$ ($0 \leq x \leq 1$, $0 \leq y \leq 1$), said active layer having a bandgap less than that of said cladding layers.

12. The semiconductor light-emitting device as defined in claim 11, which has an emission wavelength of 370 nm or less, and an external quantum efficiency ($\eta$ ext) of 0.1% or more, wherein said external quantum efficiency ($\eta$ ext)=Po/(I×V), wherein Po is a light output, I being an operating current of said device, and V being an operating voltage of said device.

13. A photodetector comprising:
    the nitride semiconductor substrate as defined in claim 1 or 6;
    a first conductive-type semiconductor layer made of $Al_xGa_{1-x-y}In_yN$ ($0.1 \leq x \leq 1$, $0 \leq y \leq 0.5$);
    a second conductive-type semiconductor layer made of $Al_xGa_{1-x-y}In_yN$ ($0.1 \leq x \leq 1$, $0 \leq y \leq 0.5$); and
    a light-absorbing layer made of $Al_xGa_{1-x-y}In_yN$ ($0 \leq x \leq 1$, $0 \leq y \leq 1$).

* * * * *